United States Patent [19]

Frisbie et al.

[11] 4,128,174

[45] Dec. 5, 1978

[54] HIGH-SPEED INTEGRATED CIRCUIT HANDLER

[75] Inventors: Milo W. Frisbie; Mavin C. Swapp, both of Mesa, Ariz.

[73] Assignee: Motorola, Inc., Schaumburg, Ill.

[21] Appl. No.: 772,696

[22] Filed: Feb. 28, 1977

[51] Int. Cl.[2] .............................................. B07C 5/344

[52] U.S. Cl. .................................... 209/573; 209/571; 198/481; 198/608

[58] Field of Search ................... 209/71, 72, 73, 74 R, 209/74 M, 81 R; 198/393, 397, 404, 408, 480, 481, 482, 803, 608

[56] References Cited

U.S. PATENT DOCUMENTS

| | | | |
|---|---|---|---|
| 1,808,301 | 6/1931 | Ferguson et al. | 209/81 R |
| 2,907,858 | 10/1959 | Distler | 198/803 X |
| 3,539,004 | 11/1970 | Baker et al. | 209/73 |
| 3,655,041 | 4/1972 | Baker et al. | 209/81 R |
| 3,822,031 | 7/1974 | Sterling et al. | 198/482 X |

*Primary Examiner*—Joseph J. Rolla
*Attorney, Agent, or Firm*—John A. Fisher

[57] ABSTRACT

An apparatus for the high-speed handling of integrated circuit parts. The apparatus consists essentially of two parts, a test wheel and a sort wheel. It singulates parts from a reservoir of untested parts, moves the parts to electrical contacts for test, moves the tested part out of the contacts and sorts the part into the proper bin.

6 Claims, 3 Drawing Figures

HIGH-SPEED INTEGRATED CIRCUIT HANDLER

BACKGROUND OF THE INVENTION

This invention relates to an apparatus for the handling of a series of individual parts, and more particularly to an apparatus for the high-speed handling of packaged integrated circuit parts.

In the semiconductor industry integrated circuits are given a series of final electrical tests before the circuits are used or sold. For economic reasons, especially in view of the very large number of circuits manufactured and tested, it is necessary that the required handling time be kept short. The total time used for implementing the final test is the sum of the actual testing time plus the time required for handling the parts. Using sophisticated computer controlled testing, the actual test time has been reduced to the order of tens of milliseconds with the exact time determined by the test required, type of computer tester, and the method used for programming the tester. The handling time includes the time to get the circuit package into position for the test plus the time to get the package out of the test fixture and into the proper bin where the proper bin is selected based on the results of the test performed. It is important to reduce the handling time to a minimum and, where possible, to perform the handling simultaneously with the testing.

Commercial machines which are presently available can handle a maximum of about 8,000 parts per hour excluding the actual testing time. The variety of prior art machines suffer from one or more of the following deficiencies which make their operation slower than desired. Air cylinders or solenoids used for singulating parts or activating contacts use up time without moving the parts. Parts moved solely by gravity move into position too slowly. Sorting mechanisms using reciprocating parts that must move and return waste time on the return. Gates and shutters are slow because they must be activated by solenoids or other means.

Accordingly, a need existed to develop a high-speed handler which would overcome the problems of prior art machines to reduce the total handling time of integrated circuit devices by more than a factor of five.

SUMMARY OF THE INVENTION

It is an object of this invention to provide an apparatus for the high-speed handling of integrated circuit parts. The apparatus will singulate the parts and pick one at a time from a column of parts, move the part quickly into the electrical contacts for test, move the tested part out of the contacts to a sort mechanism, and then deposit the part in the proper bin.

The improved through-put speed of the apparatus results from a number of elements each of which speeds up a portion of the operation. The apparatus consists basically of just two components, a test wheel and a sort wheel.

For the best utilization of time, multiple operations are carried out simultaneously with the test wheel and sort wheel operating in concert. As one part is being tested, another is being picked from the reservoir of untested parts, and still another is being moved by the sort wheel to the proper bin. As one part is being moved to the test fixture, another is being moved from the test fixture to the sort wheel. The procedure continues with parts being picked one at a time from a reservoir, tested, and dropped into the sort wheel. Neither the test wheel nor the sort wheel must return to a start position after completing an operation. Parts are held in the wheels by the force of acceleration, not through the use of gates or shutters. Parts fed or emptied under the influence of gravity have to fall only through a distance equal to their own length. Wiping contacts are used in the test fixtures so no motion is needed for contact closure. Electronic rather than mechanical means are used to control the speed and position of the wheels.

These and other elements which, operating together, improve the over-all through-put of the apparatus will be further understood from consideration of the drawings and the following detailed description.

THE DRAWINGS

DETAILED DESCRIPTION OF THE INVENTION

The first function of the apparatus is to pick a single integrated circuit part from a reservoir of untested parts and move it to a position where it can be tested. After the part is tested, the apparatus moves the tested part to a sorting mechanism. These functions are accomplished by the test wheel.

Figure 1:
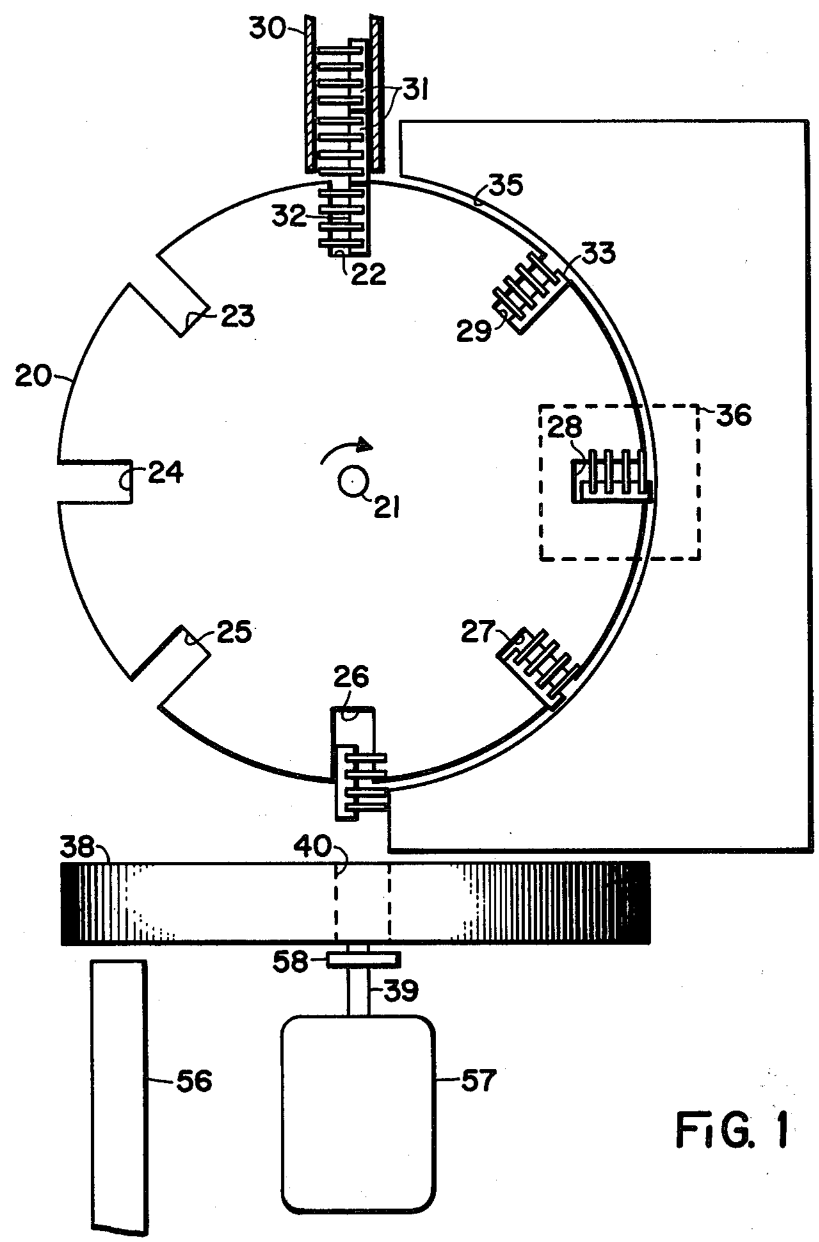
FIG. 1 is a side view of the apparatus.
Figure 2:
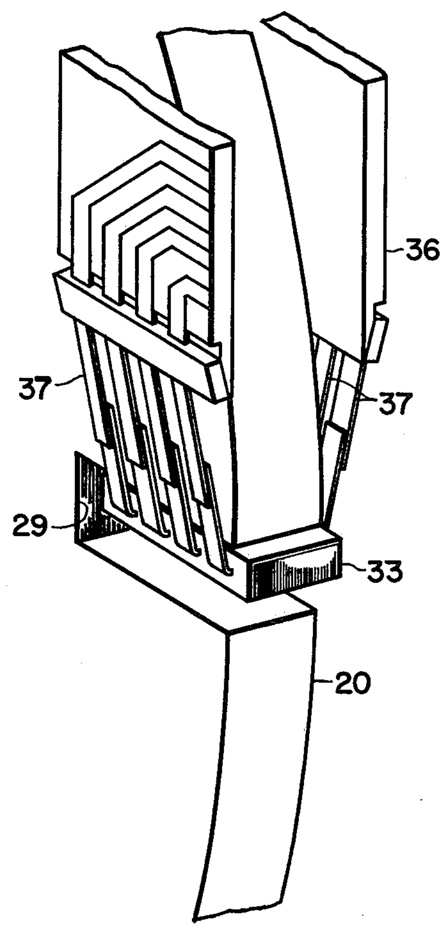
FIG. 2 is a perspective view showing the wiping contacts used in the test fixture.

FIG. 1 shows the test wheel 20 which is a low mass wheel mounted on a horizontal axis 21 and having eight slots 22–29 located at 45° increments around its periphery. The test wheel 20 can be, for example, about 5.5 inches in diameter and 0.1 inches in thickness. It can be made of aluminum or other lightweight metal. Additionally, the mass of the test wheel 20 can be further reduced by cutting away unnecessary material from the interior of the wheel. The slots 22–29 in test wheel 20 are lined with plastic inserts (not shown) to provide electrical isolation between integrated circuit parts which ride in the slots and the test wheel 20. A gravity feed reservoir 30 of untested parts 31 is provided at the top of the test wheel 20. The integrated circuit parts 31 can be packaged in any of the plastic or ceramic dual-in-line packages commonly used in the semiconductor industry. The parts 31 can have eight or more leads on a package, depending on the integrated circuit contained therein. Because different circuits may require packages of different sizes, adjustable stops are provided in slots 22–29 so that these slots can be adjusted to have a depth just equal to the length of the packages used. This allows the same handling apparatus to accommodate different parts at different times. In FIG. 1 part 32 is shown to have dropped into slot 22. Because slot 22 has been adjusted in depth so as to be the same as the length of part 32, other parts 31 in reservoir 30 are held out of the slotted wheel 20. The leads of part 32 straddle the edges of slot 22 and are electrically isolated from wheel 20 by the plastic inserts. In like manner, part 33 which previously dropped from reservoir 30 is held in slot 29. Wheel 20 is rotated through 45° in the direction shown by the arrow. A low inertia, high torque DC motor 34 used with a servo drive amplifier controls the speed and position of slotted wheel 20. As the wheel rotates, its acceleration is sufficient to force parts 32 and 33 outward against stop 35. This provides alignment of part 33 with the electrical test figure the position of which is shown by dashed line 36. Test fixture 36, which is shown more clearly in FIG. 2, is mounted on stop plate 35. Fixture 36 uses spring loaded wiping contacts 37 which straddle test wheel 20 and which provide an electrical interface between the device to be tested and the testing apparatus. Spring loaded wiping contacts are used so that no time is lost effecting a contact closure. After test wheel 20 has rotated through 45°, slot 23 is in the vertical position and another part 31 drops from the reservoir 30 into slot 23. Part 33 is now in contact with test fixture 36, part 32 is in an intermediate position between the test fixture 36 and reservoir 30, and another part 31 has dropped into the wheel.

After the testing of part 33 is completed, wheel 20 again rotates through 45° in the direction of the arrow. While wheel 20 is rotating, all parts are kept in their respective slots by stop 35. The rotation of wheel 20 through 45° moves part 33 away from the test fixture, moves part 32 into contact with the test fixture for test, moves the part in slot 23 to an intermediate position and allows another untested part 31 to drop from reservoir 30 into slot 24. After the testing of part 32 is completed, the test wheel 20 again rotates through 45°. After test wheel 20 rotates through 45°, part 33 drops from slot 29 into slot 40 in sort wheel 38. Simultaneously, the part in slot 23 moves to the test fixture and another untested part drops into slot 25. The sequence continues in this manner with individual parts being picked from the reservoir, tested, and dropped into the sort wheel.

In this particular embodiment, integrated circuit parts are classified into from two to eight categories by the test procedure. The actual number of categories is selected for the particular type of part being tested. Because this embodiment can accommodate as many as eight categories, eight sort tracks are provided. One of these sort tracks is shown as 56 in FIG. 1. It is the function of the sort wheel 38 to move the tested part to the appropriate sort track through which the part can be moved to a reservoir of similar tested parts.

Figure 3:
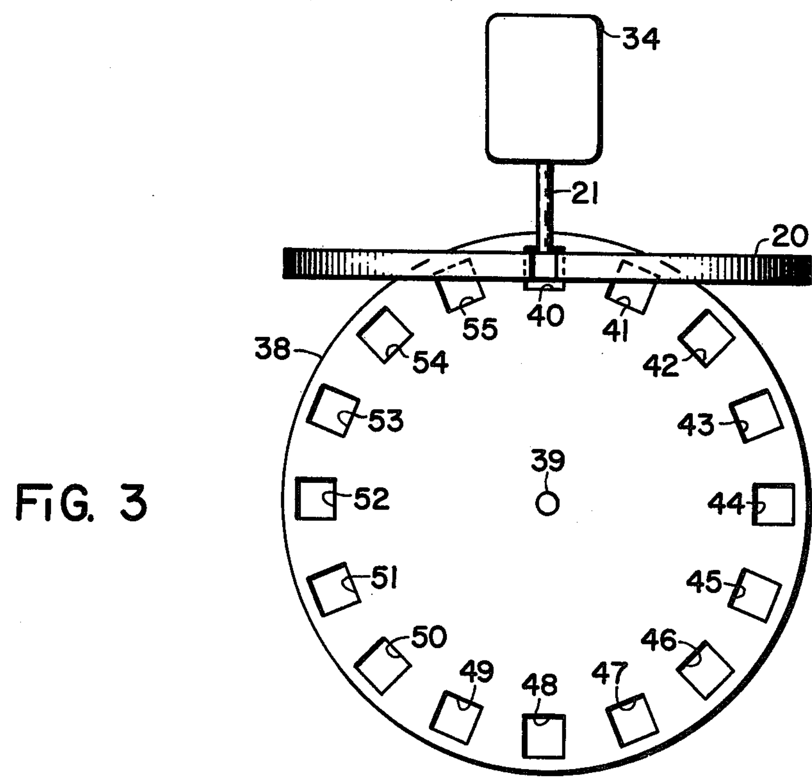
FIG. 3 is a top view of the apparatus.

Sort wheel 38 is a low-mass wheel which rotates about a vertical axis 39. The speed and position of sort wheel 38 are controlled by a low inertia, high torque DC motor 57 used with a servo drive amplifier. FIG. 3 shows that the sort wheel 38 has 16 evenly spaced holes, 40–55, provided around its circumference. These holes extend completely though the thickness of sort wheel 38.

The sort wheel 38 can be, for example, about 5 to 6 inches in diameter and 0.1 inches in thickness. It can be made of aluminum or other lightweight metal. The spaced holes 40–55 are provided with plastic inserts (not shown) about 0.75 inches in height which serve to keep the integrated circuit parts in a substantially upright position.

A stop plate 58 is rigidly mounted in a position about one-sixteenth inch below hole 40 in sort wheel 38. Eight sort tracks 56 are arranged beneath sort wheel 38 with one track positioned directly below each of the holes 41–44 and 52–55. When tested part 33 drops into hole 40 it is stopped by stop plate 58. This part 33 has been classified by the testing procedure into one of the eight selected categories. The sort wheel 38 then rotates, either clockwise or counterclockwise, and stops over the appropriate sort tracks 56. While the sort wheel 38 is rotating, the part 33 is held in hole 40 by forces of acceleration which force the part against the edges of the hole. When sort wheel 38 stops, the only force acting on part 33 is gravity, and the part 33 drops under the force of gravity into the sort track below. The sort wheel 38 is now ready to accept another part from the test wheel 20. The sort wheel 38 does not have to return to its original position as there will automatically be one of the 16 holes, 40–55, in the correct position to receive another part from the test wheel. The sort procedure performed by the sort wheel is accomplished in the same time interval that another integrated circuit part is being tested, so no additional time is required to do the sorting.

The interrelation between the function of the test wheel, the external computer tester, and the sort wheel can be controlled, for example, by a microprocessor unit. An "end-of-test" signal provided by the tester would be supplied to the test wheel servo drive amplifier to cause the test wheel to rotate. Likewise, information concerning the categorization of a tested part would be relayed to the sort wheel servo drive amplifier to cause the sort wheel to rotate to the correct sort track location. Analog tachometers are used with both the test wheel and the sort wheel to monitor the rates of change of position of the two wheels. Digital tachometers are used to monitor the positions of the two wheels.

A particular embodiment of the invention has been described, but it will be apparent to one skilled in the art that modifications in the handling apparatus can be made within the spirit of the invention. For example, the test wheel function could be accomplished with more or less than the eight slots depicted. Similarly, more than eight test categories could be accomodated by increasing the number of sort tracks and, if necessary, the number of holes in the sort wheel.

What is claimed is:

1. An apparatus for handling a series of individual parts for testing at a test fixture and sorting which comprises:

a first vertical wheel provided with slots disposed arounds its periphery for singulating said parts, presenting them for tests at said test fixture, and moving them away from said test fixture; and a second horizontal wheel for sorting said parts into a plurality of selected categories, said second wheel being positioned below said first wheel and having holes provided about its periphery for accepting said parts dropped from said first wheel.

2. The apparatus of claim 1 wherein said first wheel is a low-mass wheel which rotates about a horizontal axis in discrete partial revolutions to allow said series of individual parts in continuous sequence to drop into said slots, to be rotated into position for test, and to be further rotated to drop into said second wheel.

3. The apparatus of claim 1 wherein said second wheel is a low-mass wheel which rotates about a vertical axis to position one of said holes above a predetermined sort track allowing said part contained in said hole to drop into said sort track.

4. The apparatus of claim 1 wherein said first element and said second element work in concert so that in the time interval when said second element is sorting one of said individual parts said first element is singulating, presenting for test, testing, and moving away from the test fixture others of said individual parts.

5. The apparatus of claim 1 wherein said individual parts are integrated circuit parts packaged in dual-inline packages.

6. An apparatus for handling a series of individual parts for testing at a test fixture and sorting which comprises: a first vertical wheel provided with slots disposed about its periphery for singulating said parts, presenting them for testing at said test fixture, and moving them away from said test fixture; and a second horizontal wheel for sorting said parts, said second wheel positioned below said first wheel and having holes provided about its periphery for accepting said parts from said first wheel, said second wheel being rotatable about a vertical axis to position one of said holes above a predetermined sort location, said part being held in said hole during said rotation by the forces of acceleration.

* * * * *